US00RE44870E

(19) United States
(12) Reissued Patent
Ljungberg

(10) Patent Number: US RE44,870 E
(45) Date of Reissued Patent: Apr. 29, 2014

(54) ALUMINUM OXIDE COATED CUTTING TOOL AND METHOD OF MANUFACTURING THEREOF

(75) Inventor: Bjorn Ljungberg, Enskede (SE)

(73) Assignee: Sandvik Intellectual Property AB, Sandviken (SE)

(21) Appl. No.: 12/222,440

(22) Filed: Aug. 8, 2008

Related U.S. Patent Documents

Reissue of:
(64) Patent No.: 5,766,782
Issued: Jun. 16, 1998
Appl. No.: 08/366,107
Filed: Dec. 29, 1994

(30) Foreign Application Priority Data

Jan. 14, 1994 (SE) ..... 9400089

(51) Int. Cl.
*B32B 9/04* (2006.01)

(52) U.S. Cl.
USPC ..... 428/698; 428/699; 428/908.8; 407/119; 51/307; 51/309

(58) Field of Classification Search
None
See application file for complete search history.

(56) References Cited

U.S. PATENT DOCUMENTS

| | | | |
|---|---|---|---|
| 3,736,107 | A | 5/1973 | Hale |
| 3,836,392 | A | 9/1974 | Lux et al. |
| 3,837,896 | A | 9/1974 | Lindstrom et al. |
| 3,852,594 | A | 12/1974 | Paolini |
| 3,914,473 | A | 10/1975 | Hale |
| 3,967,035 | A | 6/1976 | Hale |
| 3,977,061 | A | 8/1976 | Lindstrom et al. |
| 4,018,631 | A | 4/1977 | Hale |

(Continued)

FOREIGN PATENT DOCUMENTS

| | | | |
|---|---|---|---|
| DE | 41 10 005 | A1 | 10/1992 |
| DE | 41 10 006 | A1 | 10/1992 |

(Continued)

OTHER PUBLICATIONS

C.-S. Park et al., "Crystallographic Orientation and Surface Morphology of Chemical Vapor Deposited $Al_2O_3$", *Journal of the Electrochemical Society*, vol. 130, No. 7, (Jul. 1983), pp. 1607-1611.

(Continued)

*Primary Examiner* — David Sample
(74) *Attorney, Agent, or Firm* — Morgan, Lewis & Bockius LLP

(57) ABSTRACT

A body such as a cutting tool coated with refractory single- or multilayers, wherein specific layers are characterized by a controlled microstructure and phase composition with crystal planes preferably grown in a preferential direction with respect to the surface of the coated body. The coating includes one or several refractory layers of which at least one layer is a dense, fine-grained layer of $\alpha$-$Al_2O_3$ preferably textured in the (104) direction. The coated tool exhibits excellent surface finish and shows much improved wear and toughness properties compared to prior art objects when used for machining steel, cast iron and, particularly, when machining nodular cast iron.

REEXAMINATION RESULTS

The questions raised in reexamination proceedings Nos. 90/009,410, and 90/009,666, filed May 5, 2009, and Feb. 24, 2010 respectively, have been considered, and the results thereof are reflected in this reissue patent which constitutes the reexamination certificate required by 35 U.S.C. 307 as provided in 37 CFR 1.570(e) for *ex parte* reexaminations, and/or the reexamination certificate required by 35 U.S.C. 316 as provided in 37 CFR 1.997(e) for *inter partes* reexaminations.

29 Claims, 1 Drawing Sheet

(56) References Cited

U.S. PATENT DOCUMENTS

| | | | |
|---|---|---|---|
| RE29,420 | E | 9/1977 | Lindstrom et al. |
| 4,180,400 | A | 12/1979 | Smith et al. |
| 4,341,834 | A | 7/1982 | Kikuchi et al. |
| 4,399,168 | A | 8/1983 | Kullander et al. |
| 4,463,033 | A | 7/1984 | Kikuchi et al. |
| 4,490,191 | A | 12/1984 | Hale |
| 4,535,469 | A | 8/1985 | Brandt |
| RE32,093 | E | 3/1986 | Hale |
| RE32,110 | E | 4/1986 | Hale |
| 4,619,866 | A | 10/1986 | Smith et al. |
| 4,698,256 | A | 10/1987 | Giglia et al. |
| 4,698,266 | A | 10/1987 | Buljan et al. |
| 5,071,696 | A | 12/1991 | Chatfield et al. |
| 5,123,934 | A | 6/1992 | Katayama |
| 5,137,774 | A | 8/1992 | Ruppi |
| 5,162,147 | A | 11/1992 | Ruppi |
| 5,487,625 | A | 1/1996 | Ljungberg et al. |
| 5,516,588 | A | 5/1996 | Van den Berg et al. |
| 5,543,176 | A | 8/1996 | Chatfield et al. |
| 5,766,782 | A | 6/1998 | Ljungberg |
| 5,980,988 | A | 11/1999 | Ljungberg |

FOREIGN PATENT DOCUMENTS

| | | | |
|---|---|---|---|
| DE | 41 31 307 | A1 | 3/1993 |
| EP | 0 032 887 | A1 | 7/1981 |
| EP | 0045291 | | 6/1984 |
| EP | 0 403 461 | A1 | 12/1990 |
| EP | 0 523 021 | A1 | 1/1993 |
| EP | 0 603 144 | A1 | 6/1994 |
| JP | 57-137460 | | 8/1982 |
| WO | WO 92/17623 | | 10/1992 |

OTHER PUBLICATIONS

Jae-Gon Kim et al., "Effect of Partial Pressure of the Reactant Gas on the Chemical Vapour Deposition of $Al_2O_3$", *Thin Solid Films*, vol. 97, Issue 1 (Nov. 1982), pp. 97-106.

Kim et al., "Effect of Partial Pressure of the Reactant Gas on the Chemical Vapour Deposition of Al2O3", Thin Solid Films, 97 (1982) pp. 97-106.

Park et al., "Crystallographic Orientation and Surface Morphology of Chemical Vapor Deposited Al2O3", J. Electrochem Soc., vol. 130 No. 7 (1983) pp. 1607-1611.

Park et al., "The Effects of Reaction Parameters on the Deposition Characteristics in Al2O3 CVD", Proceedings of the Fourth European Conference on Chemical Vapour Deposition, (1983) pp. 401-409.

Park et al., "The Effect of Reaction Condition on the Crystallographic Orientation and Surface Morphology of Chemical Vapor Deposited Al2O3", Proceedings of the Fourth European Conference on Chemical Vapour Deposition, (1983) pp. 410-420.

Affidavit of Bonnie L. Davis in Support of Protest (2 pages).

Affidavit of Michael F. Beblo in Support of Protest (4 pages).

Affidavit of Zhigang Ban in Support of Protest (6 pages).

Supplement to Reissue Declaration by Assignee executed Jul. 18, 2008 (U.S. Appl. No. 12/222,440).

Information Disclosure Statement, associated transmittal letter, and Form PTO-1449 of Feb. 1, 1996 (U.S. Appl. No. 08/366,107).

B. D. Cullity, "Diffraction II: Intensities of diffracted beams," *Elements of X-ray Diffraction*, 2nd Ed., 1978.

I. Lhermitte-Sebire et al., "The Adhesion Between Physically Vapour-Deposited or Chemically Vapour-Deposited Alumina and TiC-Coated Cemented Carbides as Characterized by Auger Electron Spectroscopy and Scratch Testing," *Thin Solid Films*, vol. 138, 1986, pp. 221-233.

L. S. Kassel, "Thermodynamic Functions of Nitous Oxide and Carbon Dioxide", *ACS Publications*, vol. 56, 1934, pp. 1838-1842.

C. Barrett et al., "Chapter 9, Pole Figures and Orientation Determination", Structure of Metals 3rd Revised Edition Crystallographic Methods, Principles and Data, *International Series on Materials Science and Technology*, vol. 35, pp. 193-222.

H. J. Bunge, "Experimental Techniques of Texture Analysis", *Experimental Techniques of Texture Analysis*, 1986, pp. 1-28.

S. A. Wilson, "Determination of Texture in Zircaloy Using Complete Pole Figures", *Scand J. Metallurgy*, vol. 18, 1989.

K. J. van Oostrum, "CAD in Light Optics and Electron Opics", *Phillips Technical Review*, vol. 42, No. 3, 1985, abstract only from INSPEC.

K. J. van Oostrum, "Display of Electron Microscope Images Obtained by Beam Rocking", *European Conference on Electrotechnics*, 1974, abstract only from INSPEC.

S. Munekawa, "Application of X-Ray Diffraction Techniques to the Semiconductor Field", *The Rigaku Journal*, vol. 5, No. 2, 1988, pp. 31-34.

A. Franks, "Some Developments and Applications of Microfocus X-ray Diffraction Techniques", *Br. J. Appl. Phys.*, Issue 9, Sep. 1958, abstract only from IOP Publishing.

G. Spitzlsperger et al., "Recharacterization of a Tungsten etch back process with special emphasis on PFC emission reduction and throughout optimization", *SPIE Proceedings* (*Society of Photo-Optical Instrumentation Engineers*), 2001, pp. 428-434.

H. Altena et al., "Formation of Whiskers on $Al_2O_3$ CVD Layers", *Fourth European Conference on Chemical Vapor Deposition*, 1983.

H. Altena et al., "Growth of $\alpha$-$Al_2O_3$ on Single and Polycrystalline Alumina Substrates by CVD", *Fourth European Conference on Chemical Vapor Deposition*, 1983, pp. 435-443.

H. Altena et al, "Influence of Trace Impurities on the Formation of $\alpha$-$Al_2O_3$ CVD", *Ninth European Conference on Chemical Vapor Deposition*, 1984, pp. 451-458.

W. A. Bryant et al., "Thickness Uniformity of CVD $Al_2O_3$ Coatings", *Ninth International Conference on Chemical Vapor Deposition*, 1984, pp. 709-713 and 716-718.

C. Chatfield et al., "Microstructure of CVD $Al_2O_3$", *Journal De Physique*, pp. C5-337-C5-388, 1989.

S. W. Choi et al., "Nucleation and Growth of $Al_2O_3$ on Si in the CVD Process", *Ninth International Conference on Chemical Vapor Deposition*, 1984, pp. 233-241.

S. S. Chun et al., "Study on the Chemical Vapor Deposition of $Al_2O_3$ for Improving Wear Resistance of Sintered Caride Tools", 1981.

R. Colmet et al., "Thermodynamic and Experimental Analysis of Chemical Vapor Deposition of Alumina from $AlCl_3$-$H_2$-$CO_2$ Gas Phase Mixtures", *Eighth International Conference on Chemical Vapor Deposition*, 1981, pp. 17-31.

M. Danzinger et al., "Influence of $CH_4$ and Ar on the Morphologies of $Al_2O_3$—CVD Coatings", *Journal De Physique*, vol. 1, Sep. 1991, pp. C2-571-C2-578.

E. Fredericksson et al., "Phase Transformation During CVD of Aluminum Oxide," *Journal De Physique*, 1989, pp. C5-391-C5-399.

R. Funk, et al., "Coating of Cemented Carbide Cutting Tools with Alumina by Chemical Vapor Deposition", pp. 469-484.

R. Funk et al., "Coating of Cemented Carbide Cutting Tools with Alumina by Chemical Vapor Deposition", *J. Electrochem. Soc.: Solid-State Science and Technology*, vol. 123, No. 2, Feb. 1976, pp. 285-289.

L. Hall et al., "Properties of Aluminum Oxide Films Obtained from Nitrous Oxide and Aluminum Trimethyl", *Second International Conference on Chemical Vapor Deposition*, 1970, pp. 637-649.

T. Johannesson et al., "Factors Affecting the Initial Nucleation of Alumina on Cemented-Carbide Substrates in the CVD Process", *J. Vac. Sci. Technology*, vol. 12, No. 4, 1975, pp. 854-857.

H. S. Kalish, "The Effect of Different Coatings on Hardmetal Machining Performance", pp. 58-69.

J. Kim et al., "Effect of Partial Pressure of the Reactant Gas on the Chemical Vapor Deposition of $Al_2O_3$", *Thin Solid Films*, vol. 97, (1982), pp. 97-106.

M. Kornmann et al., "Nucleation of Alumina Layers on TiC and Cemented Carbides by Chemical Vapor Deposition", *Journal of Crystal Growth*, vol. 28, (1975), pp. 259-262.

A. Layyous et al., "Low Pressure Chemical Vapor Deposition (CVD) on Oxide and Nonoxide Ceramic Cutting Tools", *Journal De Physique*, May 1989, pp. C5-423-C5-432.

(56) References Cited

OTHER PUBLICATIONS

C. Lee et al., The Preferred Orientation, Microhardness, and Microstructure of Chemically Vapor Deposited TiC on Cemented Carbides, *Eighth international Conference on Chemical Vapor Deposition*, 1981, pp. 563-572.
S. Lin, "Mass Spectrometric Analyses of Vapor in Chemical Vapor Deposition of Alumina", *J. Electrochem. Soc.: Solid-State Science and Technology*, vol. 122, No. 10, 1975, pp. 1405-1408.
J. N. Lindström et al., "Non-Equilibrium Conditions for CVD of Alumina", *Third European Conference on Chemical Vapor Deposition*, 1980, pp. 208-217.
J. N. Lindström et al., "Nucleation of $Al_2O_3$ Layers on Cemented Carbide Tools", *J. Electrochem. Soc.: Solid-State Science and Technology*, vol. 123, No. 4, Apr. 1976, pp. 555-559.
J. N. Lindström et al., "Nucleation of $Al_2O_3$ Layers on Cemented Carbide Tools", *Fifth International Conference on Chemical Vapor Deposition*, 1975, pp. 453-468.
J. Lindström et al., "Preparation and Machining Properties of CVD $Al_2O_3$ Coated Cemented Carbide Tools with Various Intermediate Layers", *Ninth International Conference on Chemical Vapor Deposition*, 1984, pp. 689-708.
B. Lux, "$Al_2O_3$ Deposition of CVD", Fourth European Conference on CVD, 1983, pp. 379-384.
L. C. McCandless et al., "Chemically Vapor Deposited Ceramic Coatings of Carbides and Oxides", *Second International Conference on Chemical Vapor Deposition*, 1970, pp. 423-441.
C. Park et al., "Crystallographic Orientation and Surface Morphology of Chemical Vapor Deposited $Al_2O_3$" *J. Electrochem. Soc.: Solid-State Science and Technology*, vol. 130, No. 7, Jul. 1983, pp. 1607-1611.
C. Park et al., "The Effect of Reaction Condition on the Crystallographic Orientation and Surface Morphology of Chemical Vapor Deposited $Al_2O_3$", *Fourth European Conference on Chemical Vapor Deposition, Fourth European Conference on Chemical Vapor Deposition*, 1983, pp. 410-420.
C. Park et al., "The Effects of Reaction Parameters on the Deposition Characteristics in $Al_2O_3$ CVD", *Fourth European Conference on Chemical Vapor Deposition*, 1983, pp. 401-409.
M. Podob et al., "CVD Coatings for Improved Tool Life", pp. 479-490.
R. Porat, "Thermal Properties of Coating Materials and Their Effect on the Efficiency of Coated Cutting Tools", *Eighth International Conference on Chemical Vapor Deposition*, 1981, pp. 533-539.
N. Reiter et al., "Progress in Coated Indexable Inserts for Milling", pp. 568-579.
J. Saraie et al., "Chemical Vapor Deposition of $Al_2O_3$ Thin Films under Reduced Pressures", *J. Electrochem Soc.*, vol. 132, No. 4, 1985, pp. 890-892.
T. Schmitt et al., "Influence of Temperature and Substrate on $Al_2O_3$ CVD from $AlCl_3/H_2/CO_2$ Gas Mixtures", *Fourth European Conference on Chemical Vapor Deposition*, 1983, pp. 421-427.
D. Selbmann et al., "Chemical Vapor Deposition of Al-Containing TiC- and Ti(O,C)-Hard Coatings", *Journal De Physique*, vol. 1, Sep. 1991, pp. C2-587-C2-592.
S. Vuorinen, "Microstructural Study of Alumina/TiC Coated Cemented Carbide", *Fourth European Conference on Chemical Vapor Deposition*, 1983, pp. 357-362.
S. Vuorinen, "TEM Study of TiC and Alumina/TiC Coatings on Cemented Carbides", *Ninth European Conference on Chemical Vapor Deposition*, 1984, pp. 719-727.
P. Wong et al., "Epitaxial Growth of $Al_2O_3$ on Sapphire and Ruby Substrates by Chemical Vapor Deposition", *Second International Conference on Chemical Vapor Deposition*, 1970, pp. 803-816.
C. Colombier, "Investigation of $Al_2O_3$ Layers; Influence of Substrate and Gas Phase", *Technical University of Vienna Dissertation*, May 24, 1985, 76 pages.
S. Vuorinen et al., "Characterization of $\alpha$-$Al_2O_3$ and $\kappa$-$Al_2O_3$ and $\alpha$-$\kappa$ Multioxide Coatings on Cemented Carbides", *Thin Solid Films*, vol. 193/194, 1990, pp. 536-546.
C. Columbier, "Dissertation Untersuchung an $Al_2O_3$-CVD-Schichten; Einflulβ von Substrat und Gasphase", *Technical University of Vienna*, May 24, 1985, 71 pages.
I. Lhermitte-Sebire et al., "The Chemical Vapour Deposition of Alumina From $AlCl_3$-$H_2$-$CO_2$ on a Stoichiometric TiC Substrate: A Thermodynamic Approach", *Journal of the Less-Common Metals*, vol. 118, 1986, pp. 83-102.
G. L. Tingey, "Kinetics of the Water-Gas Equilibrium Reaction. I. The Reaction of Carbon Dioxide with Hydrogen", *The Journal of Physical Chemistry*, vol. 70, No. 5, May 1996, pp. 1406-1412.
C. Cheng et al., "Homogeneous Catalysis of he Water Gas Shift Reaction Using Rhodium Carbonyl Iodide", *Journal of the American Chemical Society*, vol. 99, No. 8, Apr. 13, 1977, pp. 2791-2792.
E.M. Passmore, et al., "Strength-Grain Size-Porosity Relations in Alumina", *Journal of the American Ceramic Society*, vol. 48, No. 1, Jan. 21, 1965, pp. 1-7.
"1976 Powder Diffraction File, Search Manual", *Joint Committee on Powder Diffraction Standards*, 1976, pp. iii, v, xiii, xiv.
T.C. Huang et al., "Derivation of d-values from Digitized X-ray and Synchrotron diffraction Data," *Advances in X-ray Analysis*, vol. 33, 1990, pp. 295-303.
Kennametal's Second Supplemental Invalidity Contentions in Civil Action No. 2:10-cv-654, 2011.

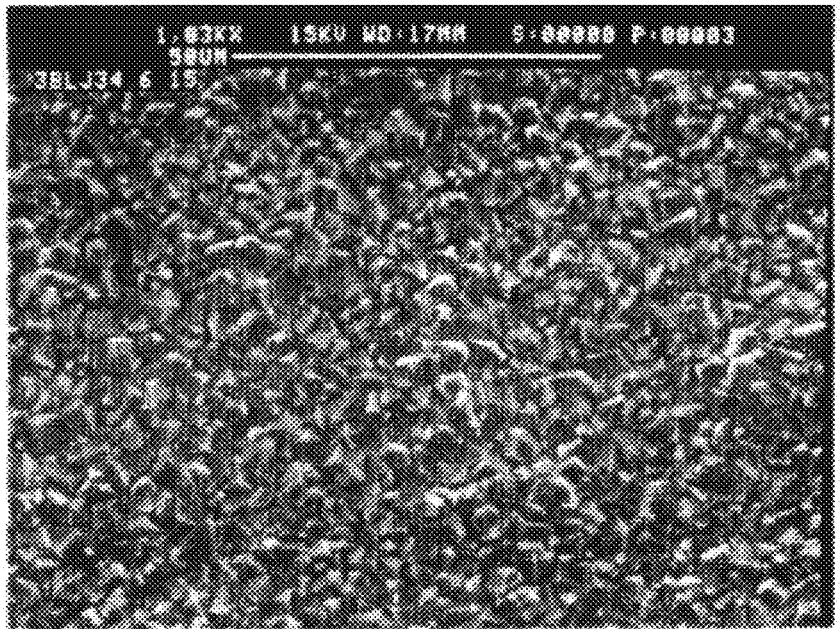
1.03KX 15KV WD:17MM S:00000 P:00003
50UM
3BLJ34 6 15

ALUMINUM OXIDE COATED CUTTING TOOL AND METHOD OF MANUFACTURING THEREOF

Matter enclosed in heavy brackets [ ] appears in the original patent but forms no part of this reissue specification; matter printed in italics indicates the additions made by reissue.

*CROSS-REFERENCE TO RELATED APPLICATIONS*

*The present application is a reissue of U.S. Pat. No. 5,766,782, which claims the benefit of priority to Swedish Application No. 9400089-0 filed Jan. 14, 1994.*

FIELD OF THE INVENTION

The invention relates to a coated cutting tool for chip-forming machining, a method of making the tool and a method of machining metal with the tool.

BACKGROUND OF THE INVENTION

Chemical Vapour Deposition (CVD) of alumina on cutting tools has been an industrial practice for more than 15 years. The wear properties of $Al_2O_3$ as well as of other refractory materials have been discussed extensively in the literature.

The CVD-technique has also been used to produce coatings of other metal oxides, carbides and nitrides, the metal being selected from transition metals of the IVB, VB and VIB groups of the Periodic Table. Many of these compounds have found practical applications as wear resistant or protective coatings, but few have received as much attention as TiC, TiN and $Al_2O_3$.

Cemented carbide cutting tools coated with various types of $Al_2O_3$-coatings e.g., pure $\kappa$-$Al_2O_3$, mixtures of $\kappa$- and $\alpha$-$Al_2O_3$ and very coarse-grained $\alpha$-$Al_2O_3$ have been commercially available for many years. $Al_2O_3$ crystallizes in several different phases: $\alpha$, $\kappa$, $\gamma$, $\beta$, $\theta$, etc. The two most frequently occurring phases in CVD of wear resistant $Al_2O_3$-coatings are the thermodynamically stable, hexagonal $\alpha$-phase and the metastable $\kappa$-phase. Generally, the $\kappa$-phase is fine-grained with a grain size in the range 0.5-2.0 μm and often exhibits a columnar coating morphology. Furthermore, $\kappa$-$Al_2O_3$ coatings are free from crystallographic defects and free from micropores or voids.

The $\alpha$-$Al_2O_3$ grains are usually coarser with a grain size of 1-6 μm depending upon the deposition conditions. Porosity and crystallographic defects are in this case more common.

Often both $\alpha$- and $\kappa$-phase are present in a CVD alumina coating deposited onto a cutting tool. In commercial cutting tools, $Al_2O_3$ is always applied on TiC coated carbide or ceramic substrates (see, e.g., U.S. Pat. No. 3,837,896, now U.S. Reissue Pat. No. 29,420) and therefore the interfacial chemical reactions between the TiC-surface and the alumina coating are of particular importance. In this context, the TiC layer should also be understood to include layers having the formula $TiC_xN_yO_z$ in which the carbon in TiC is completely or partly substituted by oxygen and/or nitrogen.

The practice of coating cemented carbide cutting tools with oxides to further increase their wear resistance is in itself well known as is evidenced in e.g., U.S. Reissue Pat. No. 29,420 and U.S. Pat. Nos. 4,399,168, 4,018,631, 4,490,191 and 4,463,033. These patents disclose oxide coated bodies and how different pretreatments e.g., of TiC-coated cemented carbide, enhance the adherence of the subsequently deposited oxide layer. Alumina coated bodies are further disclosed in U.S. Pat. Nos. 3,736,107, 5,071,696 and 5,137,774 wherein the $Al_2O_3$ layers comprise $\alpha$, $\kappa$ and/or $\alpha+\kappa$ combinations.

U.S. Pat. No. 4,619,866 to Smith describes a method for producing fast growing $Al_2O_3$ layers by utilizing a hydrolysis reaction of a metal halide under the influence of a dopant e.g., hydrogen sulphide ($H_2S$) in the concentration range 0.01-0.2% at a CVD deposition temperature of 1000-1050° C. Under these process conditions, essentially two phases of $Al_2O_3$, the $\alpha$ and the $\kappa$ phases, are produced. The resulting coating consists of a mixture of the smaller $\kappa$-grains and the larger $\alpha$-grains. The process yields coatings with an even layer thickness distribution around the coated body.

Commonly owned Swedish Patent Application 9101953-9 (corresponding to U.S. patent application Ser. No. 07/902,721 filed Jun. 23, 1992, abandoned in favor of Ser. No. 08/238,341 filed May 5, 1994, the disclosures of which are hereby incorporated by reference) discloses a method of growing a fine-grained $\kappa$-alumina coating.

Commonly owned Swedish Patent Application No. 9203852-0 (corresponding to U.S. patent application Ser. No. 08/159,217 filed Nov. 30, 1993, the disclosure of which is hereby incorporated by reference) discloses a method for obtaining a fine-grained, (012)-textured $\alpha$-$Al_2O_3$-coating. This particular $Al_2O_3$-coating applied on cemented carbide tools has been found particularly useful for machining of cast iron.

Commonly owned Swedish Patent Application No. 9304283-6 discloses a body with a coating comprising one or more refractory layers of which at least one layer is a layer of $\alpha$-$Al_2O_3$ textured in the (110) direction. The alumina layer is essentially free of cooling cracks and comprises platelike grains with a length of 2-8 μm and a length/width-ratio of 1-10.

SUMMARY OF THE INVENTION

It is an object of this invention to avoid or alleviate the problems of the prior art.

It is also an object of this invention to provide an improved process for making coated bodies, the resulting coated bodies and methods for their use.

In one aspect of the invention there is provided a body such as a cutting tool insert at least partially coated with one or more refractory layers of which at least one layer is alumina, the alumina layer having a thickness of d=0.5-25 μm with grain size (s): 0.5 μm<s<1 μm for 0.5 μm<d<2.5 μm and 0.5 μm<s<4 μm for 2.5 μm<d<25 μm. The alumina layer consists of single phase $\alpha$-structure textured in the (104)-direction with a texture coefficient larger than 1.5, the texture coefficient being defined as:

$$TC(hkl) = \frac{I(hkl)}{I_o(hkl)}\left\{\frac{1}{n}\ \Sigma\ \frac{I(hkl)}{I_o(hkl)}\right\}^{-1}$$

where I(hkl)=measured intensity of the (hkl) reflection, $I_o$(hkl)=standard intensity of the ASTM standard powder pattern diffraction data, n=number of reflections used in the calculation and (hkl) reflections used are: (012), (104), (110), (113), (024), (116). The texture coefficient can be greater than 2.5, preferably greater than 3.0.

The alumina layer is preferably an exposed outermost layer. However, other layers can be present such as in the case where the alumina layer is in contact with a $TiC_xN_yO_z$-layer.

The $TiC_xN_yO_z$-layer can be an innermost layer of the coating. The body is preferably a cutting tool insert of cemented carbide, titanium based carbonitride or ceramics. The alumina layer can have a fine-grained microstructure of alumina grains with 80% or more of the alumina grains having a grain size of ±50% of an average grain size of the alumina layer. Also, the alumina layer can have a thickness of 4 to 8 μm and an average grain size of 1 to 3 μm.

The invention also provides a method of coating a body with an αalumina coating, comprising steps of: contacting a body with a hydrogen carrier gas containing one or more halides of aluminum and a hydrolyzing and/or oxidizing agent at high temperature in a CVD-reactor atmosphere wherein oxidation potential of the reactor prior to nucleation of $Al_2O_3$ is kept at a low level by minimizing a total concentration of $H_2O$ or other oxidizing species, carrying out nucleation of $Al_2O_3$ by controlled sequencing of reactant gases such that $CO_2$ and CO are supplied to the reactor first in an $N_2$ and/or Ar atmosphere followed by supplying $H_2$ and $AlCl_3$ to the reactor, the nucleation being carried out at a temperature between 850°-1100° C. and carrying out growth of the $Al_2O_3$ by adding a sulphur dopant to the reactant gases. According to various features of the process, the dopant can comprise $H_2S$, the reactor temperature can be 950°-1000° C. during the nucleation step, and prior to the nucleation of $Al_2O_3$ the concentration of $H_2O$ or other oxidizing species in the hydrogen carrier gas is maintained below 5 ppm. Also, the body preferably comprises a cutting tool insert of cemented carbide, titanium based carbonitride or ceramics, wherein the alumina layer has a fine-grained single phase α-microstructure with 80% or more of the alumina grains having a grain size of ±50% of an average grain size of the alumina layer, the alumina layer having a thickness of 4 to 8 μm and an average grain size of 1-3 μm.

The coated body can be used for machining by contacting a metal workpiece with a cutting tool and moving the metal workpiece and the cutting tool relative to each other. The cutting tool comprises a body at least partially coated with one or more refractory layers of which at least one layer is alumina, the alumina layer having a thickness of d=0.5-25 μm with grain size (s) wherein 0.5 μm<s<1 μm for 0.5 μm<d<2.5 μm and 0.5 μm<s<4 μm for 2.5 μm<d<25 μm. The alumina layer consists of single phase α-microstructure textured in the (104)-direction with a texture coefficient larger than 1.5, the texture coefficient (TC) being defined as:

$$TC(hkl) = \frac{I(hkl)}{I_o(hkl)}\left\{\frac{1}{n}\ \Sigma\ \frac{I(hkl)}{I_o(hkl)}\right\}^{-1}$$

where I(hkl)=measured intensity of the (hkl) reflection; $I_o$(hlk)=standard intensity of the ASTM standard powder pattern diffraction data; n=number of reflections used in the calculation and (hkl) reflections used are: (012), (104), (110), (113), (024), (116). The metal workpiece can comprise a steel, stainless steel, cast iron or nodular cast iron workpiece. The cutting tool insert can be of cemented carbide, titanium based carbonitride or ceramics and the alumina layer can have a fine-grained α-microstructure of alumina grains with 80% or more of the alumina grains having a grain size of ±50% of an average grain size of the alumina layer, the alumina layer having a thickness of 4 to 8 μm and an average grain size of 1 to 3 μm.

BRIEF DESCRIPTION OF THE DRAWINGS

FIG. 1 is a photomicrograph of an $Al_2O_3$ coating in accordance with the invention.

DETAILED DESCRIPTION OF THE PREFERRED EMBODIMENTS

According to the invention there is provided a cutting tool comprising a body of a hard alloy onto which a wear resistant coating has been deposited. The coating comprises one or several refractory layers of which at least one layer is a dense, fine-grained and preferably textured $Al_2O_3$-layer of the polymorph α. FIG. 1 shows a Scanning Electron Microscope (SEM) top-view micrograph at 1000X magnification of a typical $Al_2O_3$-coating according to the invention.

A coated cutting tool according to the present invention exhibits improved wear and toughness properties compared to prior art tools when used for machining metal workpieces especially when the surface of the tool has been further smoothened by wet blasting. The alumina coated cutting tool insert provides improved cutting performance in machining steel, stainless steel, cast iron and nodular cast iron.

The invention also provides a method of applying onto a hard substrate or preferably onto a $TiC_xN_yO_z$ coating at least one single phase $Al_2O_3$ layer of the polymorph with a desired microstructure and crystallographic texture using suitable nucleation and growth conditions such that the properties of the $Al_2O_3$ layer are stabilized.

More specifically, the coated tool comprises a substrate of a sintered cemented carbide body, cermet or a ceramic body preferably of at least one metal carbide in a metal binder phase. The individual layers in the coating structure may be TiC or related carbide, nitride, carbonitride, oxycarbide and oxycarbonitride of a metal selected from the group consisting of metals in the Groups IVB, VB, and VIB of the Periodic Table, B, Al and Si and/or mixtures thereof. At least one of the layers is in contact with the substrate. However, at least one of the layers in the coating structure comprises a fine-grained, dense, single phase α-$Al_2O_3$ coating free of microporosity and crystallographic defects. This coating is preferentially textured with a thickness of d=0.5-25 μm with an average grain size (s) of:

0.5 μm<s<1 μm for 0.5 μm<d<2.5 μm and 0.5 μm<s<4 μm for 2.5 μm<d<25 μm.

The fine-grained microstructure comprises a narrow grain size distribution. Most often 80% of the $Al_2O_3$ grains have a grain size of ±50% of the average grain-size.

The grain-size of the $Al_2O_3$-coating is determined from a SEM top view micrograph at 5000X magnification. Drawing three straight lines in random directions, the average distances between grain boundaries along the lines, are taken as a measure of the grain-size.

The $Al_2O_3$-layer according to the invention has a preferred crystal growth orientation in the (104) direction which is determined by X-ray Diffraction (XRD) measurements. A Texture Coefficient, TC, can be defined in the following calculation:

$$TC(hkl) = \frac{I(hkl)}{I_o(hkl)}\left\{\frac{1}{n}\ \Sigma\ \frac{I(hkl)}{I_o(hkl)}\right\}^{-1}$$

where I(hkl)=measured intensity of the (hkl) reflection; $I_o$(hkl)=standard intensity of the ASTM standard powder pattern diffraction data; n=number of reflections used in the calculation and (hkl) reflections used are: (012), (104), (110), (113), (024), (116).

According to the invention TC for the set of (104) crystal planes is larger than 1.5, preferably larger than 2.5, and most preferably larger than 3.0.

The coated body according to the invention is further characterized by a surface roughness [(R)] ($R_a$) of the refractory coating of less than 0.3 μm over a measured length of 0.25 [μm] *mm*. Preferably, the $Al_2O_3$-layer is an exposed outermost layer.

The textured $Al_2O_3$-coating according to the invention is obtained by careful control of the oxidation potential of the CVD-reactor atmosphere prior to the nucleation of $Al_2O_3$. The total concentration level of $H_2O$ or other oxidizing species should preferably be below 5 ppm. However, the nucleation of $Al_2O_3$ is initiated by a controlled sequencing of the reactant gases as follows: $CO_2$ and CO are first entering the reactor in a $H_2$ free atmosphere (e.g., in the presence of $N_2$ or/and Ar); then, a mixture of $H_2$ and $AlCl_3$ is allowed into the reactor. The temperature can be 850°-1100° C., preferably 950°-1000° C., during the nucleation. However, the exact conditions depend to a certain extent on the design of the equipment used. It is within the purview of the skilled artisan to determine whether the requisite texture and coating morphology have been obtained and to modify the nucleation and the deposition conditions in accordance with the present specification, if desired, to effect the amount of texture and coating morphology.

The following examples are provided to illustrate various aspects of the invention, it being understood that the same are intended only as illustrative and in nowise limitative.

EXAMPLE 1

Sample A

Cemented carbide cutting inserts with the composition 6.5% Co, 8.5% cubic carbides and balance WC were coated with a 5.5 μm thick layer of TiCN. In subsequent process steps during the same coating cycle, a 6 μm thick layer of α-$Al_2O_3$ was deposited. Prior to the nucleation, the oxidation potential of the hydrogen carrier gas, i.e., the water vapour concentration, was set to a low level, less than 5 ppm. For instance, see U.S. Pat. No. 5,071,696, the disclosure of which is hereby incorporated by reference.

A hydrogen-free reaction gas mixture comprising $N_2$, $CO_2$ and CO was first introduced into the CVD-reactor. The reaction gases were sequentially added in the given order. After a preset time, $H_2$ and $AlCl_3$ were allowed into the reactor. During the deposition of $Al_2O_3$, $H_2S$ was used as a dopant.

The gas mixtures and other process conditions during the $Al_2O_3$ deposition steps are set forth in Table 1.

TABLE 1

| Process Condition | Step 1 | Step 2 |
|---|---|---|
| $CO_2$: | 4% | 4% |
| $AlCl_3$: | 4% | 4% |
| CO: | 2% | — |
| $H_2S$ | — | 0.2% |
| HCl | 1% | 4% |
| $H_2$: | balance | balance |
| Pressure: | 55 mbar | 100 mbar |
| Temperature: | 1000° C. | 1000° C. |
| Duration: | 1 hr | 7.5 hr. |

XRD-analysis of Sample A showed a texture coefficient, TC(104), of 3.2 of the (104) planes in the single in phase of the $Al_2O_3$ coating. SEM-studies of Sample A showed a fine-grained, 6 μm thick $Al_2O_3$-coating with an average grain size of 2.1 μm.

Sample B

The cemented carbide substrate of Sample A was coated with TiCN (5.5 μm) and $Al_2O_3$ (6 μm) as set forth above except that the $Al_2O_3$ process was carried out according to a prior art technique resulting in a mixture of coarse α-and fine κ-$Al_2O_3$ grains in the coating.

Coated tool inserts from Samples A and B were all wet blasted with 150 mesh $Al_2O_3$ powder in order to smoothen the coating surface. The cutting inserts were then tested with respect to edge line and rake face flaking in a facing operation in nodular cast iron (AISI 60-40-18. DIN GGG40). The shape of the machined workpiece was such that the cutting edge is intermitted or impacted twice during each revolution.

Cutting data:
Speed=150 m/min.
Cutting Depth=2.0 mm and
Feed=0.1 mm/rev.

The inserts were run one cut over the face of the workpiece. The results are expressed in Table 2 as percentage of the edge line in cut that obtained flaking as well as the rake face area subjected to flaking in relation to total contact area between the rake face and the workpiece chip.

TABLE 2

| Sample | Edge Line Flaking (%) | Rake Face Flaking (%) |
|---|---|---|
| A (invention) | 5 | 6 |
| B (comparative) | 90 | 86 |

EXAMPLE 2

The cutting inserts from Samples A and B were also tested with respect to edge line flaking in a facing operation in an alloyed steel (AISI 1518. W-no. 10580). The shape of the machined workpiece was such that the cutting edge is intermitted or impacted three times during each revolution.

Cutting data:
Speed=130-220 m/min.
Cutting Depth=2 mm and
Feed=0.2 mm/rev.

The inserts were run one cut over the face of the workpiece. The results in Table 3 are expressed as percentages of the edge line in cut that obtained flaking.

TABLE 3

| Sample | Edge Line Flaking (%) |
|---|---|
| A (invention) | 0 (according to the invention) |
| B (comparative) | 28 |

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A body at least partially coated with one or more refractory layers of which at least one layer is alumina, said alumina layer having a thickness d of 0.5 μm≤d≤25 μm with a grain size (*s*) of 0.5 μm<s<4 μm;

said alumina layer consisting of single phase α-structure textured in the (104)-direction with a texture coefficient larger than [1.5] *2.5*, the texture coefficient (TC) being defined by calculation:

$$TC(hkl) = \frac{I(hkl)}{I_0(hkl)}\left\{\frac{1}{n}\sum\frac{I(hkl)}{I_0(hkl)}\right\}^{-1}$$

where

I(hkl)=measured intensity of the (hkl) reflection $I_o$(hkl)=standard intensity of the ASTM standard powder pattern diffraction data n=number of reflections used in the calculation and (hkl) reflections used are: (012), (104), (110), (113), (024), (116), said alumina layer being an exposed outermost layer in contact with a $TiC_xN_yO_z$-layer.

2. A body according to claim 1, wherein said $TiC_xN_yO_z$-layer is an innermost layer of the coating.

3. A body according to claim 1, wherein said body is a cutting tool insert of cemented carbide, titanium based carbonitride or other ceramics.

[4. A body according to claim 1, wherein the texture coefficient is larger than 2.5.]

5. A body according to claim 1, wherein the texture coefficient is larger than 3.0.

6. A body according to claim 1, wherein the alumina layer has a fine-grained microstructure of alumina grains with 80% or more of the alumina grains having a grain size of ±50% of an average grain size of the alumina layer.

7. A body according to claim 1, wherein the alumina layer has a thickness of 4 to 8 μm and an average grain size of 1 to 3 μm.

8. The coated body of claim 1, wherein the alumina layer has been deposited by a chemical vapor deposition process wherein $H_2S$ dopant is added to reactant gases during the deposition process.

9. The coated body of claim 1, wherein the alumina layer has been deposited during a chemical vapor deposition process wherein a sulfur dopant is added to reactant gases during the deposition process.

10. The coated body of claim 1, wherein the alumina layer has a surface roughness ($R_a$) of less than 0.3 μm *over a measured length of 0.25 mm*.

11. The coated body of claim 1, wherein the alumina layer has been smoothened by wet blasting.

12. The coated body of claim 1, wherein 0.5 μm<d<2.5 μm and the grain size is greater than 0.5 μm and less than 1 μm.

13. The coated body of claim 1, wherein 2.5 μm<d<25 μm and the grain size is greater than 0.5 μm and less than 4 μm.

*14. The coated body of claim 1, wherein the texture coefficient is larger than 3.0 and the alumina layer has a fine-grained microstructure of alumina with 80% or more of the alumina grains having a grain size of ±50% of an average grain size of the alumina layer.*

*15. The coated body of claim 1, wherein the texture coefficient is larger than 3.0 and the alumina layer has a thickness d of 0.5 μm≤d≤2.5 μm and the grain size is greater than 0.5 μm and less than 1 μm.*

*16. The coated body of claim 1, wherein the texture coefficient is larger than 3.0 and the alumina layer has a thickness d of 2.5 μm<d<25 μm and the grain size is greater than 0.5 μm and less than 4 μm.*

*17. The coated body of claim 16, wherein said body is a cutting tool insert of cemented carbide, titanium based carbonitride or other ceramics.*

*18. A body at least partially coated with one or more refractory layers of which at least one layer is alumina, said alumina layer having a thickness 4 to 8 μm with an average grain size of 1 to 3 μm,*

*said alumina layer consisting of single phase α-structure textured in the (104)-direction with a texture coefficient larger than 3.0, the texture coefficient (TC) being defined by calculation:*

$$TC(hkl) = \frac{I(hkl)}{I_0(hkl)}\left\{\frac{1}{n}\sum\frac{I(hkl)}{I_0(hkl)}\right\}^{-1}$$

*where*

*I(hkl)=measured intensity of the (hkl) reflection*

*$I_o$(hkl)=standard intensity of the ASTM standard powder pattern diffraction data*

*n=number of reflections used in the calculation and (hkl) reflections used are: (012), (104), (110), (113), (024), (116),*

*wherein the alumina layer is an exposed outermost layer in contact with an inner $TiC_xN_yO_z$-layer.*

*19. The coated body claim 18, wherein the alumina layer has been smoothened by wet blasting.*

*20. The coated body of claim 18, wherein the alumina layer has a fine-grained microstructure of alumina grains with 80% or more of the alumina grains having a grain size of ±50% of the average grain size of the alumina layer.*

*21. A body at least partially coated with one or more refractory layers of which at least one layer is alumina, said alumina layer having a thickness d of 0.5 μm≤d≤25 μm with a grain size (s) of*

*0.5 μm<s<4 μm;*

*said alumina layer consisting of single phase α-structure textured in the (104)-direction with a texture coefficient larger than 3.0, the texture coefficient (TC) being defined by calculation:*

$$TC(hkl) = \frac{I(hkl)}{I_0(hkl)}\left\{\frac{1}{n}\sum\frac{I(hkl)}{I_0(hkl)}\right\}^{-1}$$

*where*

*I(hkl)=measured intensity of the (hkl) reflection*

*$I_o$(hkl)=standard intensity of the ASTM standard powder pattern diffraction data*

*n=number of reflections used in the calculation and (hkl) reflections used are: (012), (104), (110), (113), (024), (116),*

*said alumina layer being an exposed outermost layer in contact with an innermost $TiC_xN_yO_z$-layer, and*

*wherein the alumina layer has a fine-grained microstructure of alumina grains with 80% or more of the alumina grains having a grain size of ±50% of an average grain size of the alumina layer.*

*22. The coated body of claim 21, wherein the alumina layer has been smoothened by wet blasting.*

*23. A body at least partially coated with one or more refractory layers of which at least one layer is alumina, said alumina layer having a thickness d of 0.5 μm≤d≤25 μm with a grain size (s) of*

*0.5 μm<s<4 μm;*

*said alumina layer consisting of single phase α-structure textured in the (104)-direction with a texture coefficient larger than 3.0, the texture coefficient (TC) being defined by calculation:*

$$TC(hkl) = \frac{I(hkl)}{I_0(hkl)}\left\{\frac{1}{n}\sum\frac{I(hkl)}{I_0(hkl)}\right\}^{-1}$$

*where*

*I(hkl)=measured intensity of the (hkl) reflection*

*$I_o$(hkl)=standard intensity of the ASTM standard powder pattern diffraction data*

*n=number of reflections used in the calculation and (hkl) reflections used are: (012), (104), (110), (113), (024), (116),*

*said alumina layer being an exposed outermost layer in contact with a $TiC_xN_yO_z$-layer,*

*wherein the alumina layer has been deposited by a chemical vapor deposition process wherein $H_2S$ dopant is added to reactant gases during the deposition process.*

*24. The coated body of claim 23, wherein the $TiC_xN_yO_z$-layer is an innermost layer.*

*25. The body according to claim 23, wherein said body is a cutting tool insert of cemented carbide, titanium based carbonitride or other ceramics.*

*26. The coated body of claim 23, wherein the texture coefficient is larger than 3.0 and the alumina layer has a fine-grained microstructure of alumina with 80% or more of the alumina grains having a grain size of ±50% of an average grain size of the alumina layer.*

*27. The coated body of claim 23, wherein the texture coefficient is larger than 3.0 and the alumina layer has a thickness d of 0.5 μm<d<2.5 μm and the grain size is greater than 0.5 μm and less than 1 μm.*

*28. The coated body of claim 23, wherein the texture coefficient is larger than 3.0 and the alumina layer has thickness d of 2.5 μm<d<25 μm and the grain size is an 0.5 μm and less than 4 μm.*

*29. The coated body of claim 23, wherein the alumina layer has been smoothened by wet blasting.*

*30. The coated body of claim 23, wherein the thickness of the alumina layer is 4 to 8 μm and an average grain size is 1 to 3 μm.*

* * * * *